United States Patent
Mollenkopf et al.

(10) Patent No.: US 7,596,456 B2
(45) Date of Patent: Sep. 29, 2009

(54) METHOD AND APPARATUS FOR CASSETTE INTEGRITY TESTING USING A WAFER SORTER

(75) Inventors: Kelly C. Mollenkopf, McKinney, TX (US); Chris D. Atkinson, Lewisville, TX (US); Richard L. Guldi, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 525 days.

(21) Appl. No.: 11/282,997

(22) Filed: Nov. 18, 2005

(65) Prior Publication Data

US 2007/0118300 A1    May 24, 2007

(51) Int. Cl.
*G01B 3/00* (2006.01)
*G01B 5/00* (2006.01)
*G01B 3/44* (2006.01)
*G01B 3/52* (2006.01)
*G01N 37/00* (2006.01)

(52) U.S. Cl. .............................. 702/34; 702/33; 702/82

(58) Field of Classification Search ............. 702/33–36, 702/150, 40, 81, 82, 84, 94, 95, 159, 166, 702/170, 172, 179, 181; 700/108, 112–114, 700/121, 228, 229

See application file for complete search history.

(56) References Cited

U.S. PATENT DOCUMENTS

| | | | |
|---|---|---|---|
| 4,713,551 A * | 12/1987 | Layman et al. | 250/559.12 |
| 5,755,332 A | 5/1998 | Holliday et al. | |
| 6,137,303 A | 10/2000 | Deckert et al. | |
| 6,144,926 A * | 11/2000 | Ishizawa et al. | 702/94 |
| 6,188,323 B1 * | 2/2001 | Rosenquist et al. | 340/686.5 |
| 6,791,346 B2 | 9/2004 | Mehta et al. | |
| 6,848,066 B2 * | 1/2005 | Atkinson et al. | 714/724 |
| 6,950,721 B2 | 9/2005 | Tashiro et al. | |
| 2003/0130761 A1 * | 7/2003 | Schauer | 700/213 |

* cited by examiner

*Primary Examiner*—Michael P Nghiem
(74) *Attorney, Agent, or Firm*—Wade J. Brady, III; Frederick J. Telecky, Jr.

(57) ABSTRACT

A system and methods for the evaluation of the integrity of a wafer cassette and the disposition thereof are based upon evaluation of wafer measurement data obtained using a wafer sorter cassette mapping system utilized in-line during wafer sorting operations. In one embodiment, wafers are placed into slots in the wafer cassette. A wafer sorter cassette mapping sensor is scanned over the wafers in the wafer cassette. The positions of the wafers are measured while scanning the sensor over the wafers. The wafer position measurements are evaluated using a modeling system to determine slot positions, and a determination of the integrity of the cassette is generated. If the integrity determination indicates that the cassette is deformed beyond a predetermined value, the cassette is replaced. The measurement data may be stored in a data base for further trend analysis or for replacement forecasting.

23 Claims, 9 Drawing Sheets

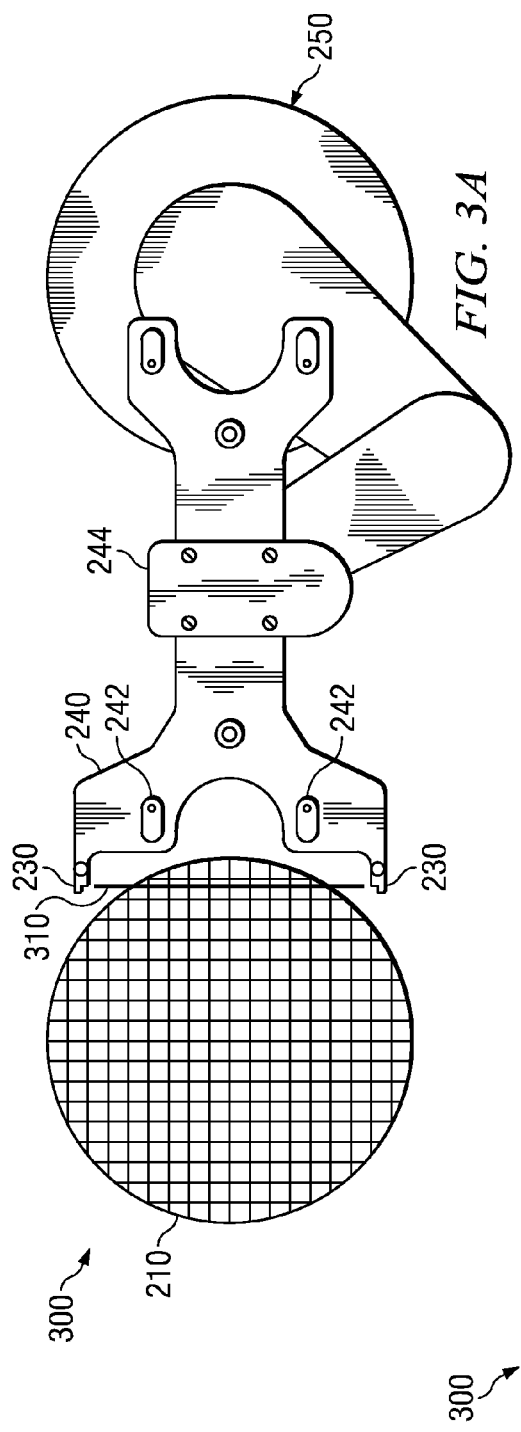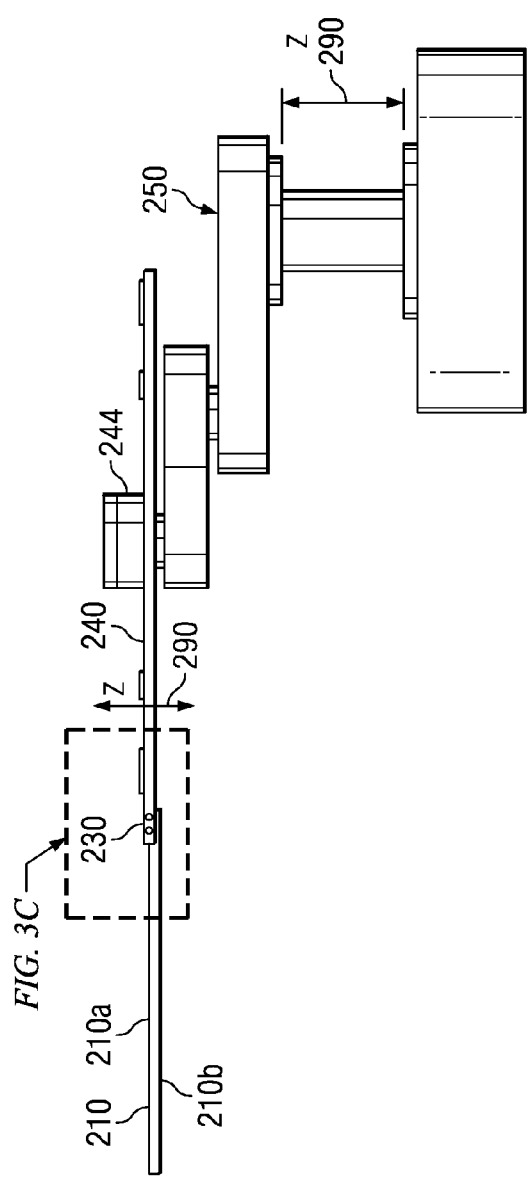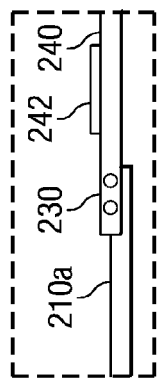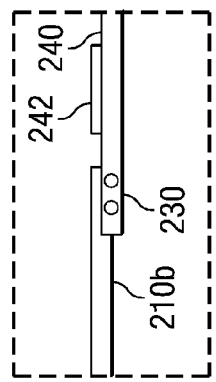

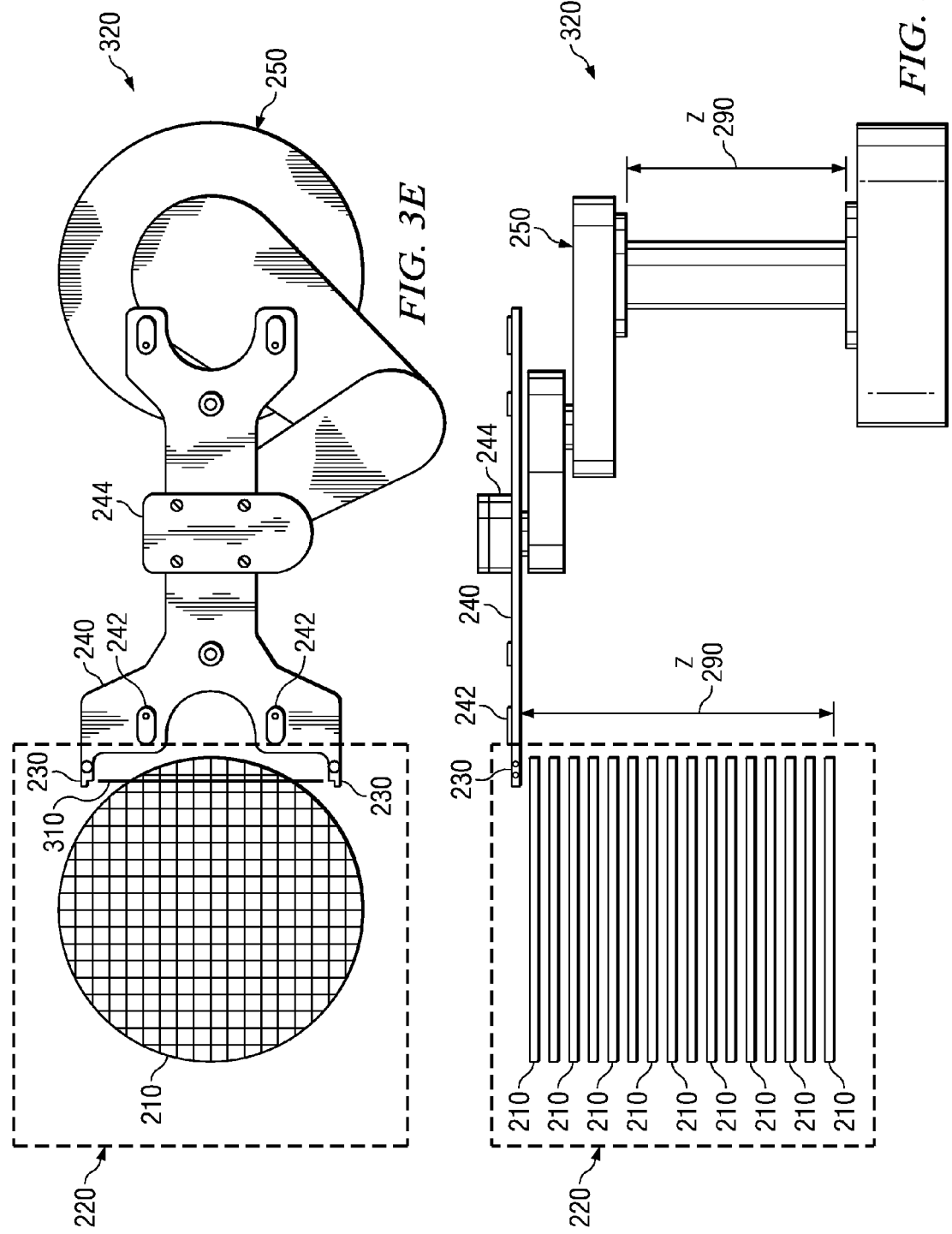

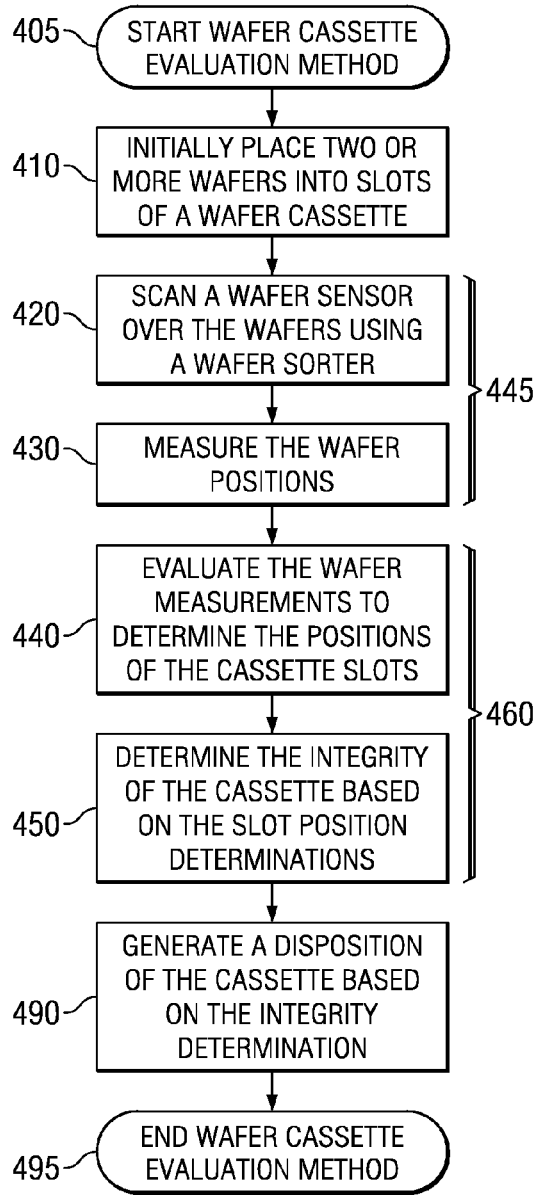
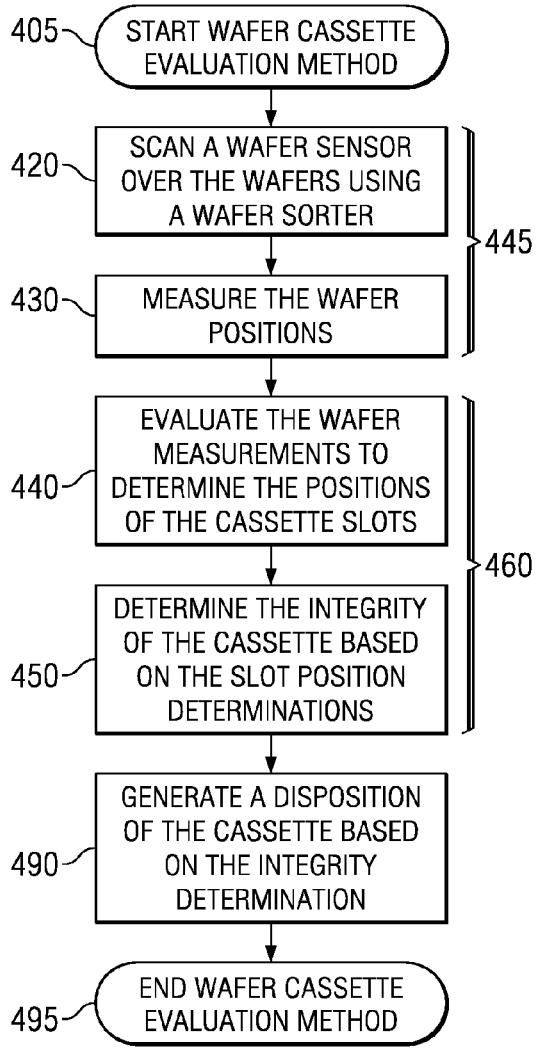

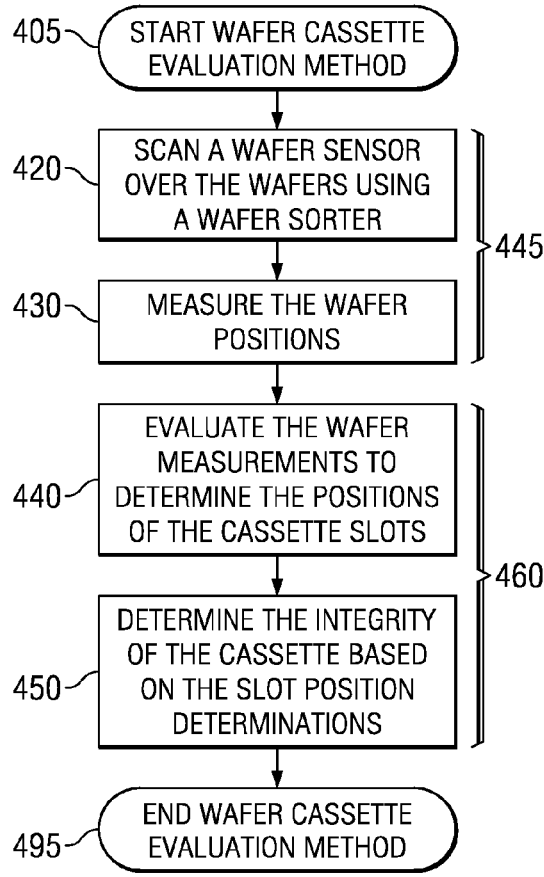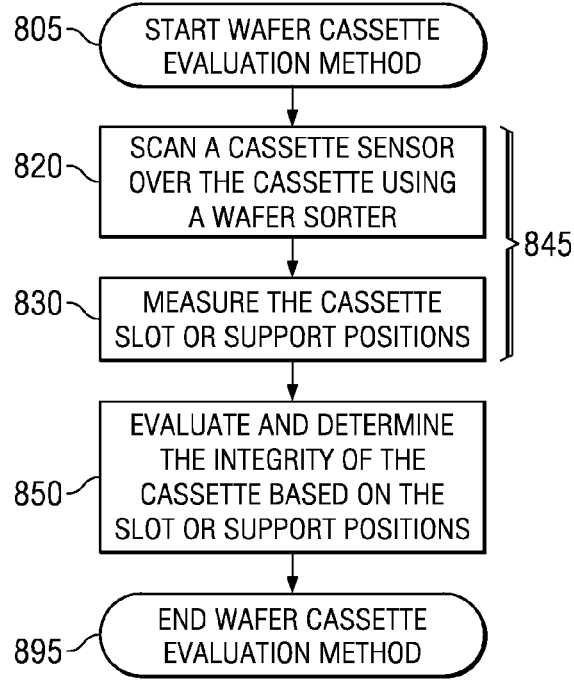

METHOD AND APPARATUS FOR CASSETTE INTEGRITY TESTING USING A WAFER SORTER

FIELD OF INVENTION

The present invention relates generally to semiconductor wafer fabrication, and more particularly to apparatus and methods for the measurement and mapping of wafer cassettes and the disposition thereof based upon evaluation of the measurement data obtained using a wafer sorter cassette mapping system used in-line during wafer sorting operations in the manufacture of semiconductor products.

BACKGROUND OF THE INVENTION

Wafer sorters or wafer handling systems are commonly used in the manufacture and fabrication of various semiconductor devices. Such systems are used to automatically monitor wafer positions in cassettes and/or randomize wafers within the cassette between one process or testing operation station and another without human contact. Typically, a wafer handling system may employ a wafer handling robot or another such handling system that loads wafers into or out from a wafer carrier called a wafer cassette. A wafer cassette may hold an entire manufacturing lot of up to 25 wafers within evenly spaced slots of the cassette.

Once loaded, wafer cassettes may also be used as a carrier for the lot of wafers between the process or test operation stations to support the wafers without damage. Various wafer cassette designs are used, but typically the cassettes utilize wafers having a single wafer diameter. Some current wafer sorters pick wafers from or place wafers into the cassette by the use of a vacuum assisted end effector mounted on the wafer handling robot. The vacuum securely holds the bottom surface of the wafer down to the top of the end effector during the pick and place or sorting operations.

During process or testing operations, if a wafer is found to be sufficiently damaged, the wafer may be sorted out of the lot or otherwise identified by the process system for rejection. Various fixed sensors around a wafer cassette may sometimes be used to identify missing wafers or wafers protruding from the cassette but may not provide much, if any, information about the condition of the cassette.

Currently, in the fabrication of semiconductor devices, there is an ever increasing trend and need for greater process yield. Process yield has been found to be impacted by wafer scratches and other damage caused by the mishandling of the wafers by the wafer sorter or other processing equipment. In some cases, the root cause of such scratched or damaged wafers is that the wafer cassette has become warped, compressed, tilted or otherwise deformed. Wafer cassettes may become deformed due to thermal exposure, UV exposure, normal wear, crushing, prolonged or excessive stacking, dropping, or various other causes of damage or deformation. Such deformed wafer cassettes may result in wafer slots which are out of position relative to those which are expected (taught positions) by the sorter robot, for example, and may therefore cause a wafer to be dropped, scratched by the end effector, scratched by the wafer cassette, scratched by another wafer, or otherwise damaged or mishandled.

In addition, manufacturing variations between wafer cassettes, may contribute to the above mentioned deformation of wafer cassettes. Although one prior art cassette checking system has been attempted, this tester only verified the flatness of the lower surface of the cassette housing in a separate off-line test.

Accordingly, there is a need for a system and method for the measurement, evaluation, and disposition of wafer cassettes based upon evaluation of the measurement data obtained in-line during wafer sorting operations in the manufacture of semiconductor products.

SUMMARY OF THE INVENTION

The following presents a simplified summary in order to provide a basic understanding of one or more aspects of the invention. This summary is not an extensive overview of the invention and is neither intended to identify key or critical elements of the invention nor to delineate the scope thereof. Rather, the primary purpose of the summary is to present some concepts of the invention in a simplified form as a prelude to the more detailed description that is presented later. The invention relates to methods and systems for the evaluation of the integrity of a wafer cassette and the disposition thereof based upon evaluation of wafer measurement data obtained using a wafer sorter cassette mapping system utilized in-line during wafer sorting operations in the fabrication of semiconductor devices. The apparatus and methods are applicable to silicon wafer fabrication and other such fabrication processes in the manufacture of semiconductor devices.

In one aspect of the invention, the cassette evaluation system comprises two or more wafers (e.g., silicon wafers, known good test wafers, or wafer test blanks), a wafer cassette (e.g., a molded plastic cassette) having a plurality of slots or supports in the wafer cassette for holding the wafers, and a wafer sorter (e.g., a wafer handling system or a robot and motion control system) operable to hold (e.g., using a vacuum assist) and to pick a wafer from or place a wafer into one of the plurality of slots in the wafer cassette. The cassette evaluation system further comprises a wafer sorter cassette mapping sensor (e.g., an optically coupled through-beam fiber optic sensor, scan head, or another such wafer detecting sensor) affixed to the wafer sorter used to scan the sensor over the wafers in the slots of the wafer cassette, the sensor being used to measure the positions of the wafers within the cassette.

In one implementation, the wafer sorter cassette mapping sensor has a light emitting diode to provide a light beam and a photo transistor able to detect the light beam coupled horizontally across the width of the cassette and parallel with the surface of a wafer. Thus, when a wafer is present in the cassette, the light beam will be broken by the edge of the wafer. The wafer sensor is scanned vertically over the wafers using the wafer handling robot or another such scanning mechanism. The vertical position of each wafer edge encountered can then be measured by the wafer handling system as the sensor is scanned vertically past the upper and lower surfaces of each wafer in the cassette. The measured difference between each of these upper and lower surfaces may then be evaluated to provide information relevant to the integrity of the cassette.

The cassette evaluation system also comprises a modeling system operable to map and evaluate the wafer position measurements, to determine slot positions within the cassette, and to make a cassette integrity determination and a disposition thereof based upon the evaluation of the wafer position measurements (e.g., the measured thickness of the wafer, the average pitch or average range of variation from an expected wafer position).

Thus, a deformation of the cassette or a wafer may be determined from any deviations in the known or expected positions of the wafer supports inferred from the wafer position measurements. The measured positions may be mapped using the modeling system (e.g., a Tool Interdiction Modeling System or TIMS model) used to capture the slot position and identify cassettes that do not meet a predetermined or expected value. This modeling may be accomplished on all such tools or on designated tools. Different predetermined limits or criteria may be developed depending on the seriousness or level of deformation of the wafer cassette. For example, a worst case deformation may require immediate cassette replacement, while a moderate level of deformation may be used to trigger an alert to manufacturing of a potential future replacement. In any event, measurement and evaluation data may be fed to a central manufacturing database to aid in cassette replacement forecasting. Further, some wafer deformation may be discerned using the apparatus and methods of the present invention.

The difference between the expected wafer positions and the measured wafer positions is calculated and used to generate a disposition for the cassette and wafers based on the integrity of the cassette. For example, in another aspect of the invention, the disposition comprises replacing the cassette if the evaluation of the wafer position measurements indicates a deformation of the cassette above a predetermined value. The manufacturing database may then be updated for trend analysis or for replacement forecasting if the evaluation of the wafer position measurements indicates deformation of the cassette below the predetermined value.

In one or more aspects of the present invention, a cassette evaluation method comprises initially placing two or more wafers into two or more of a plurality of slots in the wafer cassette. A wafer sorter cassette mapping sensor affixed to the wafer sorter is then scanned over the two or more wafers in the slots of the wafer cassette, for example, using a wafer sorter. The positions of the wafers in the wafer cassette are then measured while scanning the sensor over the wafers. The wafer position measurements are then evaluated using a modeling system to determine or infer slot positions within the cassette associated with the wafer position measurements, and a determination of the integrity of the cassette is generated based on the slot position determinations.

In another aspect, if the integrity determination indicates that the cassette is deformed beyond a predetermined value, the cassette may be replaced and/or the measurement data may be stored in a data base for further trend analysis or for replacement forecasting.

In still another aspect of the invention, the cassette integrity disposition comprises replacing the cassette if the evaluation of the wafer position measurements indicates: a compression or side-to-side deformation of the cassette, wherein a slot pitch P, comprising the distances between any two slots, is less than a predetermined value PDV (e.g., $P<PDV$), a deformation of the cassette causing a cross-slotted wafer, wherein the thickness T of a wafer is about equal to the slot pitch P (e.g., $T\sim P$), or a warped or tilted cassette, wherein the thickness T of a wafer is greater than about double the expected wafer thickness XT, and less than about the slot pitch P (e.g., $2.1XT<T<P$), and rejecting the wafers for further yield analysis if the evaluation of the wafer position measurements indicates that two or more wafers are doubly stacked, wherein a thickness T of a wafer, comprising the difference between a lower and an upper wafer position measurement is about double an expected wafer thickness XT (e.g., $T\sim 2XT$, or 1.9XT to 2.1XT).

In yet another aspect, the invention further comprises generating a determination of the integrity of the wafers based on the evaluation of the wafer position measurements within the wafer cassette, and determining a disposition of the wafers based on the integrity determination. For example, if the wafer evaluation indicates a bowed or warped wafer, wherein a thickness T of a wafer, comprising the difference between a lower and an upper wafer position measurement is greater than about 1.1 times an expected wafer thickness XT, and less than about double the expected wafer thickness XT (e.g., $1.1XT<T<1.9XT$).

Alternately, the wafer support positions may be measured directly utilizing another sensor configuration, and such alternate configurations are anticipated in the context of the present invention.

In another aspect of the present invention, the cassette evaluation system may comprise a sensor which is configured to directly measure the upper and lower surfaces associated with the wafer slots (the space between the wafer supports) within the wafer cassette, and further comprises a modeling system operable to evaluate the slot or support positions and to make a cassette integrity determination and a disposition thereof based upon the evaluation of the slot or support position measurements.

In one or more method aspects of the present invention, the cassette is scanned by a sensor using a wafer sorter. The slot or support positions of the cassette are measured during the scanning. The cassette slot positions are then evaluated, and the integrity of the cassette is determined based on the measured slot positions.

In another aspect of the invention, the slot position measurements comprise measuring a lower surface of the slot (the top surface of the support) and an upper surface of the slot (the bottom surface of the support).

In yet another aspect of the present invention, the cassette integrity disposition comprises replacing the cassette if the evaluation of the slot position measurements indicates a deformation of the cassette above a predetermined value, and updating a manufacturing database for trend analysis or for replacement forecasting, if the evaluation of the slot position measurements indicates deformation of the cassette below the predetermined value.

In still another aspect of the invention, the disposition of the cassette comprises replacing the cassette if the evaluation of the slot position measurements indicates: a compression or side-to-side deformation of the cassette, wherein a slot pitch P, comprising the distances between any two slots, is less than a predetermined value (e.g., $P<PDV$), a deformation of the cassette, wherein the slot pitch P, is greater than a predetermined value (e.g., $P>PDV$), a deformation of the cassette, wherein a slot height SZ, is less than a predetermined value (e.g., $SZ<SZDV$), wherein the slot height is determined by evaluating the differences between a lower slot position associated with the bottom surface of the slot and an upper slot position associated with the top surface of the slot within the wafer cassette, and a deformation of the cassette, wherein a difference between a first slot pitch P1 on a first side of the cassette and a second slot pitch P2 on a second side of the cassette is greater than a predetermined value (e.g., $P1-P2>PDV$).

The inventors of the present invention have realized that the wafer positions are indicative of the slot positions, and therefore represent a variety of problems which result in the deformation of the cassette.

In the past, only basic indicators, such as a go/no-go gauge of the position of the cassette was available. The present invention, however, provides a more complete measurement and mapping by a cassette evaluation model that points to the level and causes of cassette deformation and stores measurement data for trend analysis and replacement forecasting. The method employs monitoring such additional data to make the cassette evaluation model more sensitive to deformation trends observed in-line between exposure patterning and etch processing steps, for example, without adding processing steps or time. The methods, moreover, may advantageously achieve significantly improved device yield and a corresponding decrease in device cost.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIGS. 3A and 3B are top plan and front views, respectively illustrating an example wafer sorter robot and a wafer in a sensing position for measuring one of the positions of the wafer with a fiber optic scan head, such as may be employed in the fabrication of semiconductor wafer manufacturing in accordance with one or more aspects of the present invention;

FIGS. 3C and 3D are enlarged views of a wafer in upper and lower sensing positions, respectively, of FIGS. 3A and 3B, for measuring the positions of the wafer with the fiber optic scan head, such as may be employed in the fabrication of semiconductor wafer manufacturing in accordance with one or more aspects of the present invention;

FIGS. 3E and 3F are top plan and front views, respectively, illustrating an example wafer sorter robot and a plurality of wafers in a wafer cassette during scanning operations of the wafers, wherein the position measurements of the wafers are obtained with a fiber optic scan head, for the evaluation of the integrity of a wafer cassette, in accordance with one or more aspects of the present invention;

FIGS. 4-8 are flow diagrams of example methods of measuring and evaluating the integrity of a wafer cassette and/or a wafer employing the use of a wafer sorter and a cassette evaluation system similar to that of FIG. 2 in accordance with the present invention.

DETAILED DESCRIPTION OF THE INVENTION

Figure 1A:
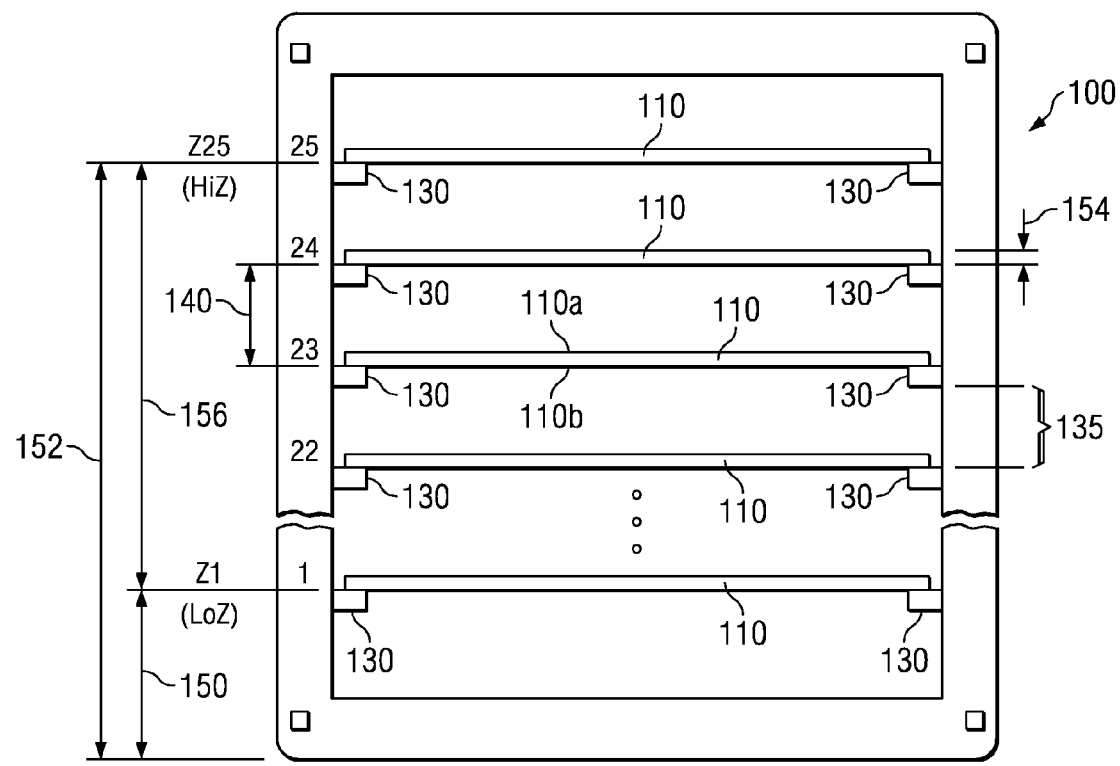
FIGS. 1A and 1B are simplified views of an undeformed wafer cassette in which a plurality of semiconductor wafers are supported by a plurality of regularly spaced wafer supports, such as may be used during wafer sorting operations in the fabrication of semiconductor wafer manufacturing.

The present invention will now be described with reference to the attached drawings, wherein like reference numerals are used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

The invention provides methods and systems for cassette mapping and evaluation employed in the fabrication of semiconductor wafers and devices, wherein the wafers or wafer slots are measured and evaluated to determine whether the cassette and/or the wafer is within specification or has become deformed. The wafer/slot measurements are then evaluated and/or mapped employing a modeling system that is also used to generate trends and forecast cassette replacement from the measurement data in order to mitigate wafer damage and wafer mishandling due to cassette warping or deformation.

As indicated above, the inventors of the present invention have appreciated that wafer scratches, or even wafer breakage may result from severely deformed wafer cassettes whose wafer slots are out of the expected positions taught to wafer sorter robots, for example. Accordingly, such wafer damage can have a significant impact on device yield and costs. Further, the added level of measurements taken may actually mitigate some collision damage to, for example, the wafer sorter robot end effector or to the wafer cassettes.

Such cassette deformation may be caused by vertical compression of the cassette, side-to-side warping, or cassette tilting, any of which may be caused by thermal exposure or mishandling, for example. The result of these various types of deformation may be that the wafer slots of the cassette have become compressed or unevenly spaced and may cause the wafers to be double-stacked, cross-slotted, or tilted within the cassette. In almost all cases, the wafer will end up in an orientation or position that is not expected by the wafer handling robot and may then result in wafer mishandling, scratches, breakage, damage to the sorter, or other such wafer-sorter induced collision damage. The expected wafer positions of a good cassette containing known good wafers (or other such test blanks) is taught to the wafer handling robot by having the robot scan the wafers in the cassette.

Example implementations are hereinafter illustrated and described in the context of cassette mapping and evaluation thereof utilizing a wafer sorter employed in the fabrication of semiconductor wafers and devices, wherein the wafer sorter is used to scan a sensor over the wafers or the wafer slots to obtain position measurement data used in a modeling system to evaluate the integrity of the cassette, and wherein the structures illustrated are not necessarily drawn to scale. It will be appreciated that the invention may be employed in mapping wafer or slot positions, and mapping wafer or cassette deformation effects in-line during or between current processing steps, as well as between other such wafer handling operations apart from the example processes described and illustrated herein. These and other benefits will become more apparent as the following figures are described. The following discussion will further establish some of the problems and issues relating to cassette deformation and wafer handling issues associated with wafer fabrication processes.

Figure 1B:
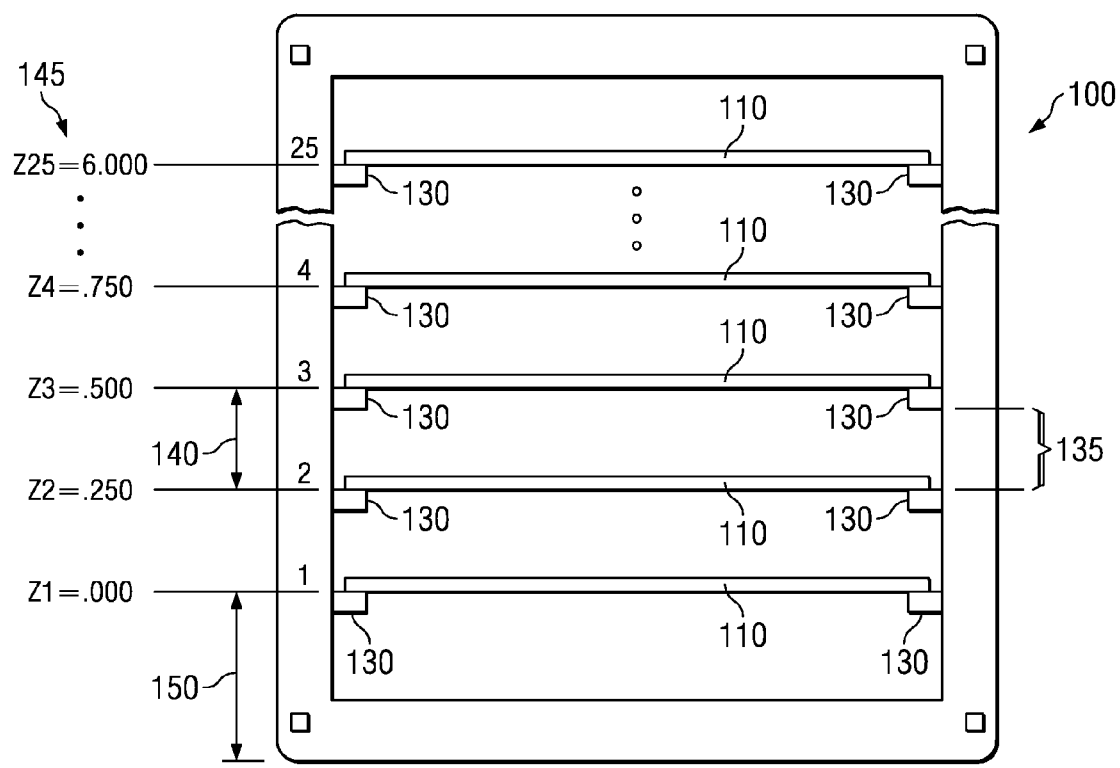

FIGS. 1A and 1B illustrate a good undeformed wafer cassette 100, such as may be used in accordance with the present invention during wafer sorting operations in the fabrication of semiconductor wafers. Cassette 100 may typically hold an entire manufacturing lot, for example, of 25 wafers 110 that are supported by a plurality of 25 regularly spaced wafer supports 130. The space between the supports is known as a slot 135 in which the wafer 110 is held, while the distance between the supports 130 is known as the slot pitch P 140.

The wafer handling robot or wafer sorter robot (see 250 of FIG. 2) is taught Z-axis (height) positions Z1-Z25 (145) corresponding to expected positions, for example, on the wafers 110 or on the wafer supports 130 of wafer cassette 100. In addition, it is anticipated that each wafer position measurement is allowed to vary within a finite range of predetermined or allowable Z-axis values identified as a deviation ΔZ from the expected (ideal) wafer position XZ. These expected Z-axis positions allow the robot to know where to pick (up) or place (down) a wafer 110. In the illustrated wafer cassette 100, the slot or support pitch P 140 is 0.250 inches. The lowest Z height position Z1 or LoZ 150, may be taught to the robot and identified as a Z height reference height of 0.000 inches, where in the example, Z1=0.000, Z2=0.250, Z3=0.500, Z4=0.750, Z5=1.000 . . . Z25=6.000 inches. In this example, wherein the cassette holds 25 wafers, Z25 at a height of 6.000 inches, is also the highest Z position HiZ 152.

In accordance with the present invention, the wafer sorter robot will scan and measure the wafers 110 of the cassette 100, measuring the upper surface 110a and the lower surface 110b of the wafers 110 in the cassette. The lower wafer surface scan measurements 110b, allow a determination of the top surface of the wafer support 130 or generally the slot position, which may be inferred from the wafer measurements. Alternately, the wafer support positions Z1-Z25 may be measured directly utilizing another sensor configuration, and such alternate configurations are anticipated in the context of the present invention.

The Z-axis distance between the upper surface 110a and the lower surface 110b is identified as the wafer thickness T 154, for example, typical semiconductor wafers may have a thickness T 154 of about 0.023 inch to about 0.032 inch thick. The distance between the lowest position LoZ 150 and the highest position HiZ 152 may be identified as the Z-axis range ZR 156 and may be calculated as ZR=HiZ−LoZ. In the present example, a 25 wafer cassette has a range ZR 156 of ZR=6.000−0.000=6.000 inches. Ideally, in the good cassette 100, all wafers 110 and wafer supports 130 are present at the expected (known) Z height positions Z1-Z25 (e.g., nominal Z heights), evenly spaced apart by an expected pitch XP (e.g., nominal pitch), and have an expected thickness XT (e.g., nominal thickness).

In a known good cassette having known good wafers, the difference in the measured Z-axis position Z (of a wafer surface) and the expected position XZ should be within an allowable or predetermined deviation ΔZ (|Z−XZ|<=ΔZ) (e.g., |Z−XZ|<=0.030). Also, the difference (range) between a maximum deviation from the expected wafer position (MXZ) and a minimum deviation from the expected wafer position (MNZ) may be calculated and compared to an allowable (predetermined) range R. Thus, the calculated range MXZ−MNZ between these two values may not be greater than R (MXZ−MNZ<R) (e.g., MXZ−MNZ<0.025). The predetermined or allowable values will typically be set by the manufacturer based on the expected wafer thickness and the cassette tolerances desired.

Figure 1C:
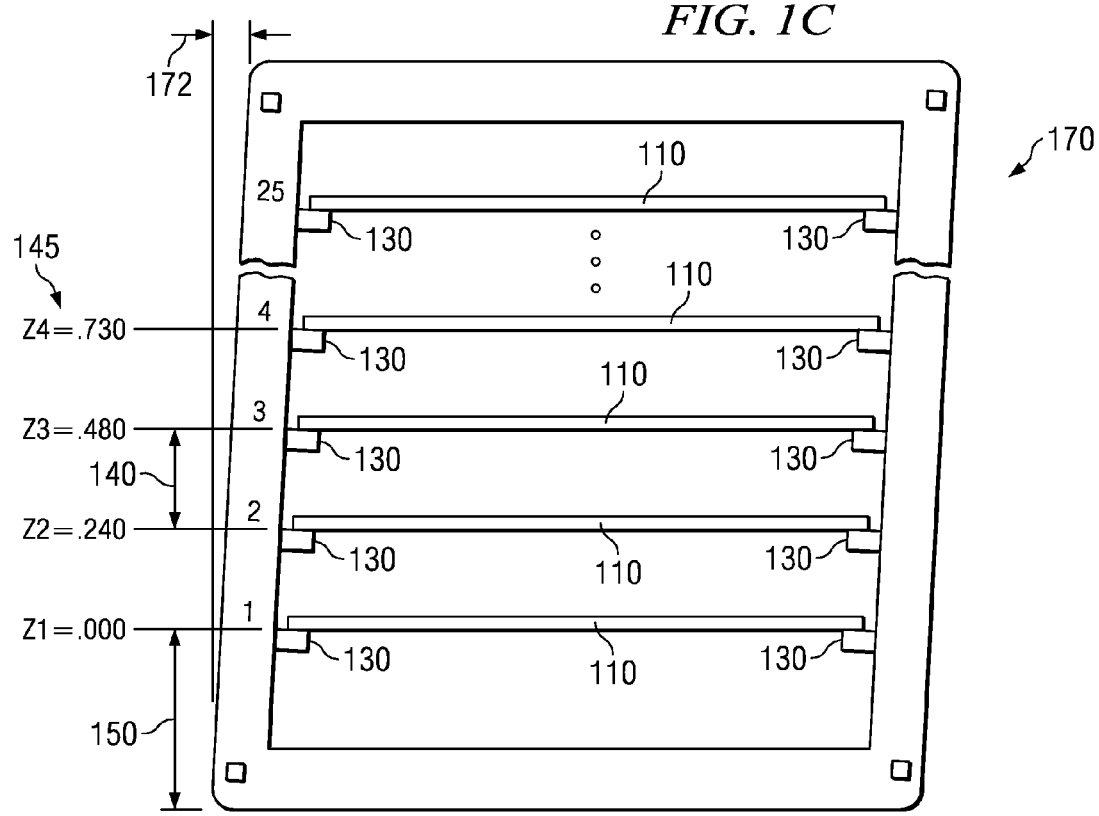
FIGS. 1C-1E are simplified views of a deformed wafer cassette in which a plurality of semiconductor wafers are supported by a plurality of wafer supports, such as may be used during wafer sorting operations in the fabrication of semiconductor wafer manufacturing.
Figure 1D:
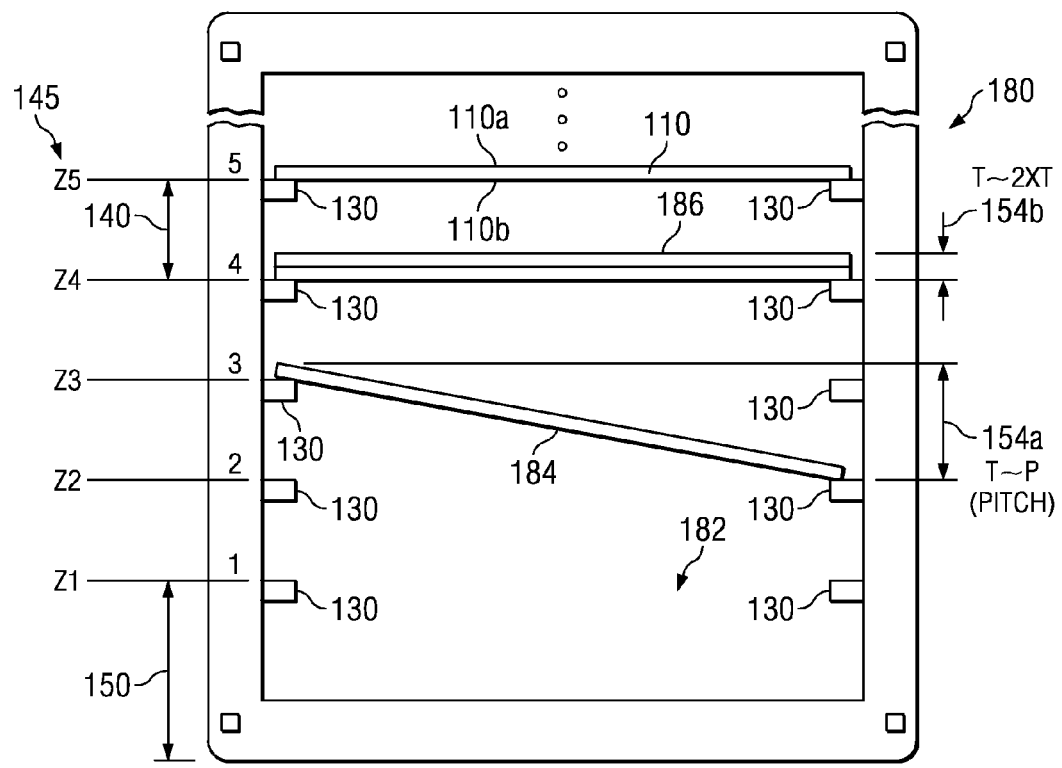
Figure 1E:
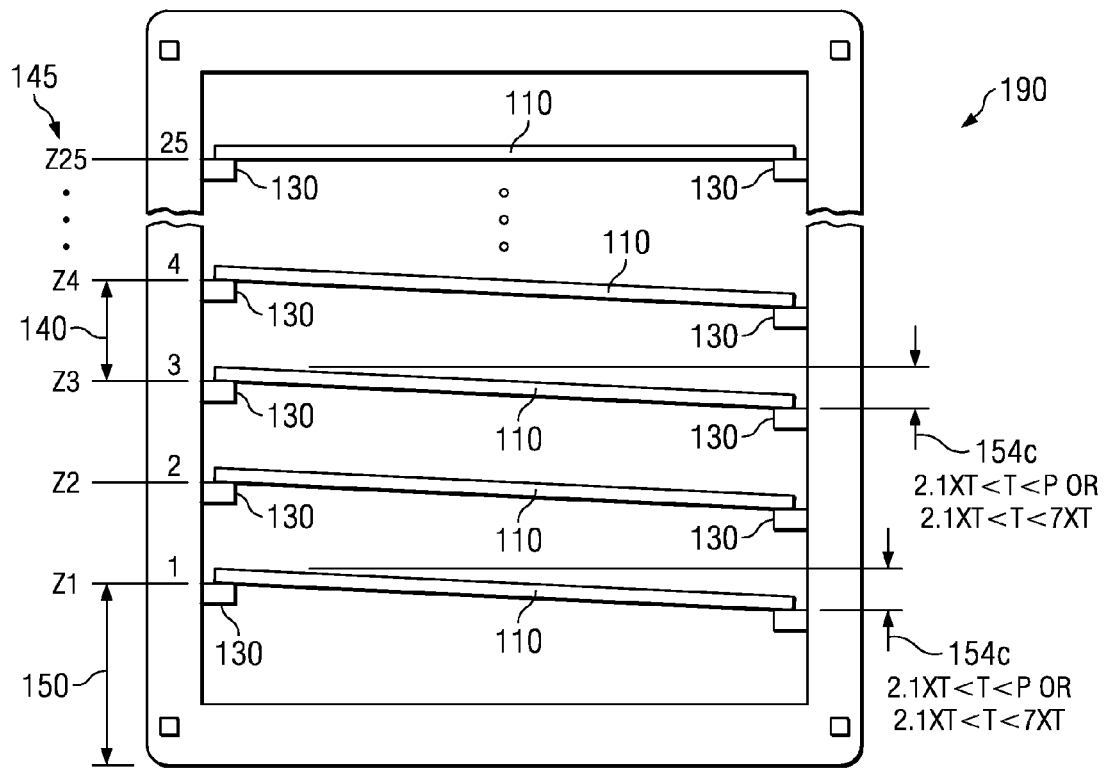

FIGS. 1C-1E illustrate various types of deformation that may occur in a wafer cassette used during wafer sorting operations in the fabrication of semiconductor wafer manufacturing.

For example, FIG. 1C illustrates a cassette 170, wherein a cassette compression or a side-to-side deformation has occurred due to a variety of causes such as those discussed previously. Cassette 170 is illustrated suffering from a side-to-side deformation 172 or another such deformation that results in a reduced slot pitch P 140. For example, relative to Z1 at 0.000 inch, Z2 at 0.240 inch demonstrates a 0.010 inch compression differential height from the nominal Z2=0.250, Z3 at 0.480 inch is compressed 0.020 inch from the expected Z3=0.500, and Z4 at 0.730 inch is also compressed 0.020 inch from the expected Z4=0.750 inch height.

In particular, the slot pitch P 140 between wafer slots #1 and #2, for example, is 0.240−0.000=0.240 inch, and the slot pitch P 140 between wafer slots #2 and #3, for example, is 0.480−0.240=0.240 inch, which is a change (delta, Δ) in the pitch P 140 of 0.010 inch from the expected nominal pitch P of 0.250. Although the change between any two slots is minimal and may cause some types of wafer mishandling, when this compression effect is extended to wafer position Z25, the cassette deformation may accumulate to an unacceptable level of deformation that may cause a variety of wafer-sorter collisions, mishandling, and wafer damage. Accordingly, although a predetermined limit may be set on a slot-to-slot change in pitch P 140, the change in the Z-axis range ZR 156 (ZR=HiZ−LoZ) (e.g., Z25−Z1) over the entire height of the cassette 170 is also more likely to best represent the overall average change in pitch for such types of cassette deformation.

In FIG. 1D, another wafer cassette 180 is deformed in such a manner that a cross slotted wafer 184 or a double stacked wafer 186 is detected. When the upper and lower surfaces 110a and 110b, respectively, are scanned and measured for each wafer position Z1-25, a thickness T 154 may easily be determined as the difference between these two measurements T=Zxb−Zxa, where x is the slot #. For example, a cross-slotted wafer 184 may be identified as occurring when the apparent or calculated wafer thickness T 154a is about the same as, or slightly more than the pitch (T~P). This is because the wafer sensor on the end effector of the robot (see FIG. 2) senses the lower surface 110b at height Z2 and the upper surface 110a at height Z3, and everywhere in between.

Similarly, double stacked wafer 186 of FIG. 1D may be identified as occurring when the calculated wafer thickness T 154b is about twice the expected thickness XT of a single wafer (e.g., T~2XT, or 1.9XT<T<2.1XT). A double-stacked wafer may scratch at least one exposed wafer surface and may experience further scratching or mishandling when attempting to pick up the wafers or move them about. It is even possible that the top wafer will fall off the lower wafer and break during movement.

FIG. 1E illustrates still another wafer cassette 190 wherein the cassette is warped or tilted in such a way that the wafers and the wafer slots are tilted, being higher on one side of the cassette than the other side. As before, the wafer thickness T provides a handy measure of cassette deformation, wherein the calculated wafer thickness T 154c is greater than about twice the expected thickness XT of a single wafer, and less than about seven times the expected thickness XT (2.1XT<T<7XT), or between about twice the expected wafer thickness XT and the nominal or expected pitch P (2XT<T<P). If the calculated wafer thickness T is less than this range, (e.g., T~2XT, or 1.9XT<T<2.1XT), then the double stacked wafer would more likely be the best determination, whereas if the calculated wafer thickness T is greater than this range, (e.g., T>7XT, or T>P), then a cross-slotted wafer would more likely be the best determination.

Figure 1F:
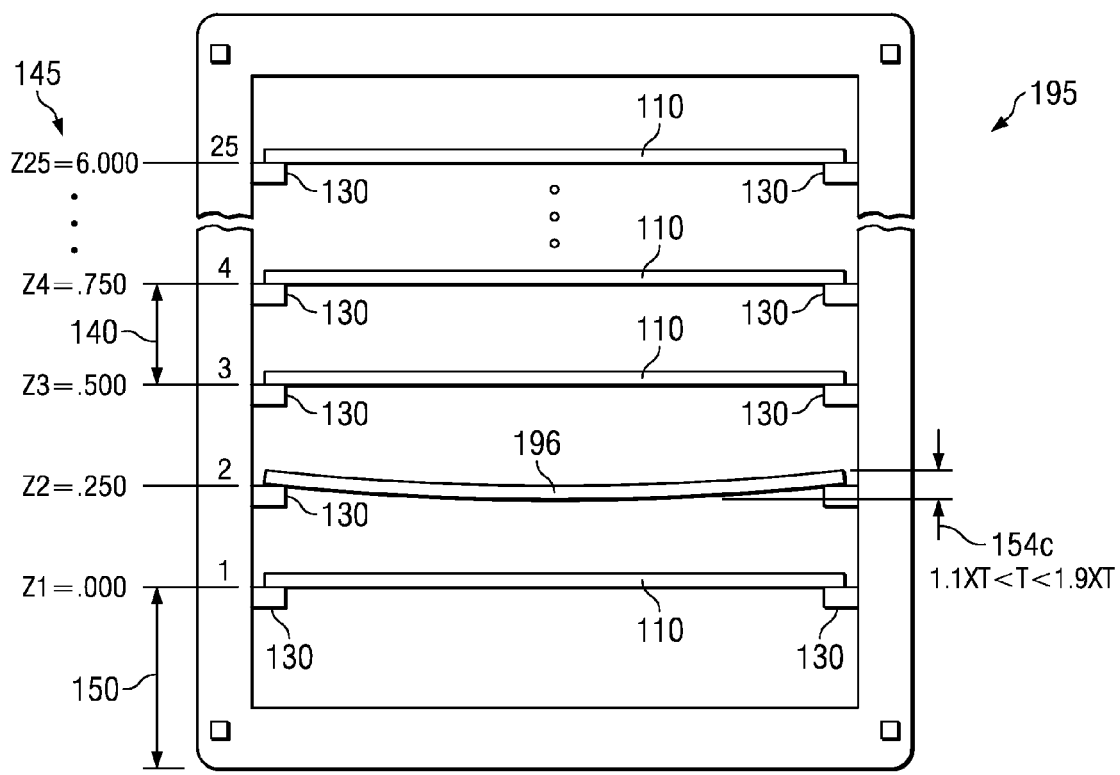
FIG. 1F is a simplified view of an undeformed wafer cassette in which a plurality of semiconductor wafers are supported by a plurality of regularly spaced wafer supports, and wherein a deformed wafer may be identified during wafer sorting operations in the fabrication of semiconductor wafer manufacturing.

FIG. 1F illustrates another undeformed wafer cassette 195 similar to that of FIGS. 1A and 1B, but holding a deformed wafer 196. Deformed wafer 196 is, for example, bowed or warped, and may be identified during wafer sorting operations in the fabrication of semiconductor wafer manufacturing, again, by measuring the wafer thickness T 154d. To differentiate a bowed or warped wafer from the thickness of a single wafer or a double stacked wafer, the range of thickness may be assumed to be somewhere between these respective thickness values. For example, a bowed or warped wafer 196 may have a calculated thickness T 154*d* of (e.g., 1.1XT<T<1.9XT, or 1.1XT<T<2XT).

In response to these cassette deformation problems and issues, an improvement to the wafer sorter end effector has been developed employing a modeling system that provides in-line measurements and evaluation of cassette integrity as well as trend analysis thereof.

Figure 2:
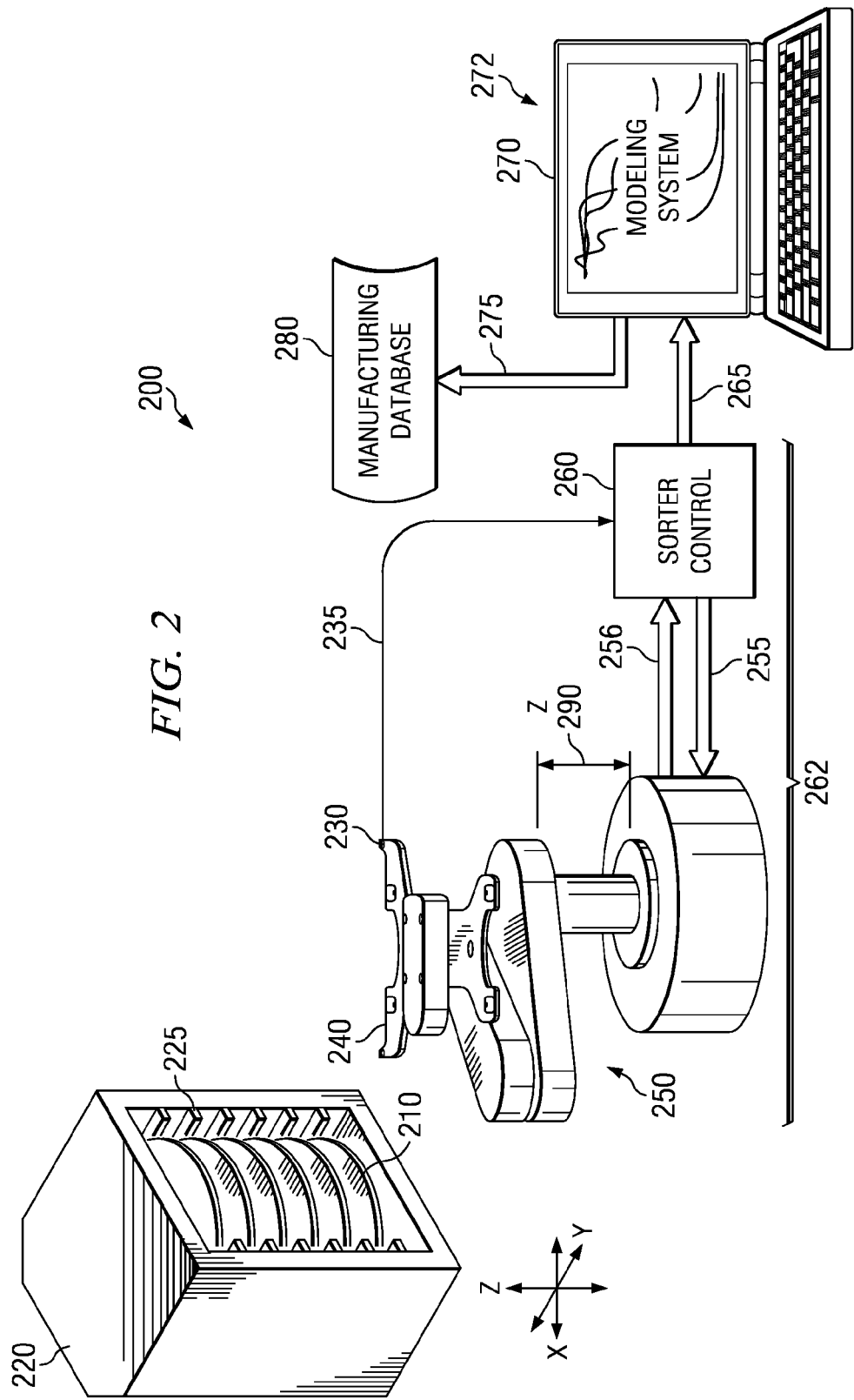
FIG. 2 is a simplified perspective representation of an example cassette testing and evaluation system such as may be used during semiconductor wafer fabrication in accordance with one or more aspects of the present invention.

FIG. 2, for example, illustrates a sample cassette measurement and evaluation system 200, such as may be used during semiconductor wafer fabrication in accordance with one or more aspects of the present invention.

The cassette measurement and evaluation system 200 comprises, for example, a plurality of semiconductor wafers 210 held within a wafer cassette 220 by a plurality of wafer supports 225. The wafers 210 and/or the wafer cassette 220 are scanned for measurement by a sensor 230 such as fiber optic scan heads or wafer sorter cassette mapping sensor, mounted on an end effector 240 of a wafer sorter robot 250 that is typically used to handle the wafer during wafer sorting operations.

Between such various wafer sorting operations, the sensor 230 is scanned vertically over the wafers 210 and/or the wafer cassette 220 to provide sensor data 235 associated with the positions of the wafers 210 or the wafer supports 225. Motion control 255 is output to the wafer sorter robot 250 by a sorter controller 260, collectively comprising a wafer sorter or wafer handling system 262. The sensor data 235 along with servo position data 256 are fed to the sorter controller 260, which provides wafer position data 265 to a modeling system 270. The modeling system 270, for example, comprises a PC utilizing a modeling algorithm 272 for mapping the positions of the wafers 210 or wafer supports 225 of the wafer cassette 220 and for evaluating the integrity of the cassette 220, and in some cases the integrity of the wafers 210.

The modeling system 270 of the cassette measurement and evaluation system 200 provides cassette mapping and evaluation data 275 that may further be routed to a database 280 (e.g., a central database used by manufacturing) for storing the cassette mapping and evaluation data 275 for replacement forecasting and for further cassette trend analysis.

In operation, the wafer sorter cassette mapping sensor 230 is scanned up and down vertically, along the Z-axis 290 using the wafer sorter robot 250, for example. In one implementation of the present invention, the sensor 230 comprises a fiber optic thru-beam coupler which produces a beam of light that is interrupted by the presence of a wafer 210. As the sensor 230 is scanned in the Z-axis 290, the current Z-axis servo position of the robot 250 at the top and bottom (e.g., 110*a* and 110*b*, respectively) of each wafer 210 may be used to identify the position Z1-Z25 (e.g., 145) and thickness T (e.g., 154) of the wafers 210. As indicated previously, in FIGS. 1A-1F, the positions and calculated thickness T of the wafers 210 provide measurement data useful for the mapping and evaluation of the wafer cassette 220 and/or the wafer 210.

FIGS. 3A and 3B illustrate top and front views, respectively, of an example of a portion of a wafer sorter or wafer handling system 300 similar to that of FIG. 2, and as such, need not be completely described again for the sake of brevity. Wafer sorter portion 300 comprises wafer sorter robot 250 and a wafer 210 in a sensing position for measuring one of the positions of the wafer 210 with a fiber optic scan head 230.

FIGS. 3C and 3D further illustrate enlarged views of a wafer 210 in upper and lower sensing positions, respectively, for measuring the positions of the wafer 210. The upper and lower positions of FIGS. 3C and 3D are measured with a thru-beam 310 of the fiber optic scan head 230, such as may be employed in the fabrication of semiconductor wafer manufacturing in accordance with one or more aspects of the present invention.

FIGS. 3A-3D also illustrate vacuum pads 242 affixed to the sorter end effector 240, controlled by a vacuum and sensor control box 244 for holding the bottom of a wafer 210 during wafer sorting or other such wafer handling operations. Wafer 210 has an upper surface 210*a* which is sensed as the light beam 310 of sensor 230 scans in the Z-axis 290 past the upper surface 210*a* of the wafer 210, as shown in FIG. 3C. Wafer 210 also has a lower surface 210*b* which is sensed as the light beam 310 of sensor 230 scans in the Z-axis 290 past the lower surface 210*b* of the wafer 210, as shown in FIG. 3D. In the present example, the sensor 230 and wafer sorter servo provide a Z-axis positional resolution of about 0.001 inch to about 0.002 inch.

FIGS. 3E and 3F further illustrate top plan and front views, respectively, of another example of a portion of a wafer sorter or wafer handling system 320 similar to that of FIGS. 2, 3A, and 3B, and as such, need not be completely described again for the sake of brevity. Wafer sorter portion 320 comprises wafer sorter robot 250 and a plurality of wafers 210 in a wafer cassette 220 during scanning operations of the wafers 210. The position measurements of the wafers 210 are obtained with a fiber optic scan head 230, for the evaluation of the integrity of a wafer cassette 220, in accordance with one or more aspects of the present invention.

As the sensor 230 is scanned in the Z-axis 290 past each wafer 210 within the cassette 220, the upper and lower surface (210*a*, 210*b*) positions of the wafer 210 are measured and recorded for evaluation of the cassette 220. The modeling algorithm 272 of the modeling system 270 may then be used to map the positions of the cassette 220 and evaluate the integrity of the cassette 220.

For example, if the distance between the upper and lower surfaces of each wafer is about the expected 0.025 inch thickness XT, then it may be reasonably concluded that the wafers are held relatively flat by the cassette. In addition, if the distance between each wafer (pitch P) is about the expected pitch distance of 0.250 inch, then it may also be reasonably concluded that the cassette is not compressed vertically or otherwise deformed side-to-side.

Accordingly, one aspect of the present invention provides a method for evaluation of a wafer cassette using a wafer sorter and a wafer sensor. One implementation of the present invention accomplishes this by measuring the Z-axis dimensions to each surface of a plurality of wafers within a wafer cassette, then determining the slot positions of the cassette associated with the wafer position, and evaluating the integrity of the cassette based on the slot position determinations. A disposition of the cassette may then be generated based on the cassette integrity determination. Alternately, a sensor configured to scan and directly measure features of the cassette may be used, in accordance with another aspect of the invention.

One such method 400 is illustrated in FIG. 4, representing a method for evaluation of a wafer cassette 220 using a wafer sorter 262 and a wafer sensor 230 similar to those of the cassette evaluation system 200 of FIG. 2 in accordance with several aspects of the present invention. Although the example method 400 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers, wafer cassettes, wafer sensor, wafer handling system, and modeling system illustrated and described herein as well as in association with other apparatus and structures not illustrated.

Method 400 comprises an example wafer cassette evaluation method that may be used in the fabrication of semiconductor device wafers (e.g., 210 of FIG. 2) using a cassette evaluation system similar to that of system 200 of FIG. 2, the method beginning at 405. Initially, at 410, two or more wafers 210 are placed into slots (between supports 225) of a wafer cassette 220. At 420 the wafers are scanned with a wafer sensor 230 affixed to and utilizing a wafer sorter 262. The positions of the wafers 210 are measured with the wafer sensor 230 at 430. The scanning 420 and measuring steps 430 are collectively identified as a scanning and measuring step 445.

At 440, the wafer 210 measurements are evaluated to determine the positions (e.g., Z1-Z25 145) associated with the slots 135 between the wafer supports 225. The integrity of the cassette 220 is then determined at 450 (e.g., using the modeling algorithm 272 and the modeling system 270) based on the slot position determinations. The wafer measurement evaluation 440 and the cassette integrity determination step 450 are collectively identified as an evaluation and determination step 460.

Thereafter, a disposition is then generated for the cassette at 490, based on the cassette integrity determination, and the cassette evaluation method 400 ends at step 495. Thus, the wafers 210 of the cassette 220 are scanned and measured to infer associated slot positions and to evaluate the cassette integrity.

For example, 25 wafers 210 may initially be placed in a wafer cassette 220. The wafer sorter robot 250 then scans the fiber optic scan head 230 (e.g., vertically in the Z-axis 290) across the wafers 210 to measure the wafer positions (e.g., the upper and lower wafer surface positions, 110a, 110b, respectively, or the lower positions Z1-Z25 145 and the wafer thicknesses) within the cassette 220. The wafer position measurements are then evaluated, for example, by the modeling algorithm 272 of the modeling system 270 to determine the positions of associated cassette slots 135 or the wafer supports 130 and the integrity of the cassette 220, based on the cassette slot position determinations. For example, if it is determined that the pitch P 140 between the wafers or slots is compressed by comparison to the expected nominal pitch, then a disposition may be made to have the wafer lot put on hold for cassette removal and replacement at the end of the wafer sorting operation.

FIG. 5 illustrates another example method 500 of measuring and evaluating the integrity of a wafer cassette and/or a wafer employing the use of a wafer sorter and a cassette evaluation system similar to system 200 of FIG. 2 in accordance with the present invention. Method 500 is similar to that of method 400, and as such need not be fully described again for the sake of brevity. In method 500, for example, the step 410 of initially placing two or more wafers 210 into slots 135 of the wafer cassette 220, may be considered a precondition for the measurement or otherwise optional as wafers may be already present in the cassette from another prior operation. Further, it will be appreciated in the context of the present invention that dummy wafers, wafer blanks or some other type of substitute for the wafers 210 having known dimensions may be utilized to evaluate the dimensions of the cassette 220 and any deformation thereof.

FIG. 6 illustrates yet another example method 600 of measuring and evaluating the integrity of a wafer cassette and/or a wafer employing the use of a wafer sorter and a cassette evaluation system similar to system 200 of FIG. 2 in accordance with the present invention. Method 600 is similar to methods 400 and 500, and as such need not be fully described again for the sake of brevity. In method 600, for example, step 490 wherein the generating a disposition of the cassette based on the integrity determination, may be considered optional, with this disposition of the cassette accomplished in another subsequent operation, or at another manufacturing station, for example.

Figure 7:
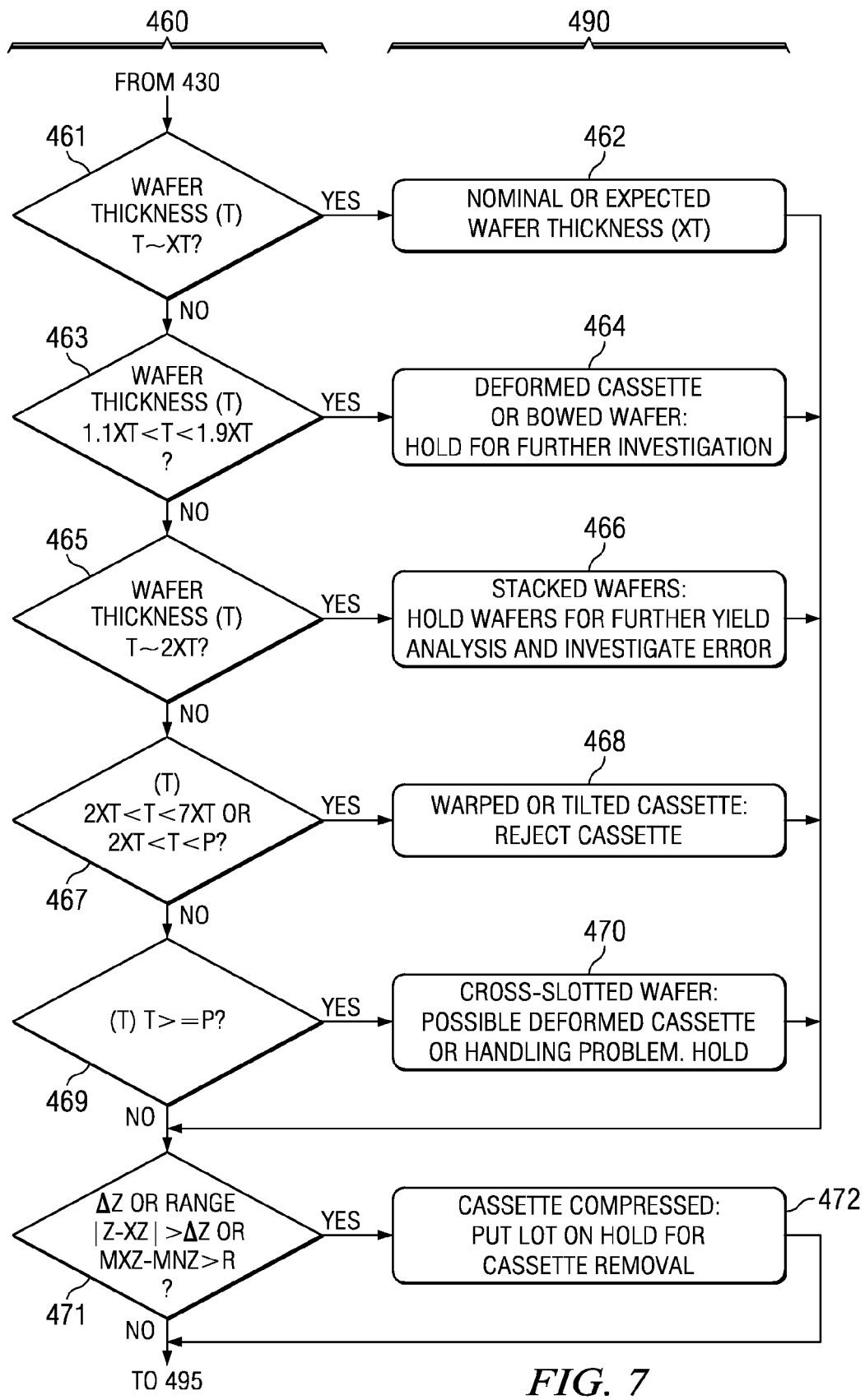

FIG. 7 illustrates one implementation of the evaluation and determination step 460 and the disposition step 490 of methods 400, and 500 of FIGS. 4 and 5 in accordance with the present invention. For example, after measuring the wafer positions in step 430, the wafer measurements may then be used to determine the wafer thickness T and the slot pitch P, which may be used to identify various types of cassette deformation. In addition, given the allowable or predetermined difference within each wafer position $\Delta Z$ and/or an allowable (predetermined) range R between the maximum and minimum deviations from the expected wafer position, cassette deformations due to compression may be identified. Once the various types of cassette deformation have been identified, an appropriate disposition for the cassette may then be made.

In the present implementation, for example, each wafer thickness is evaluated at 461 to determine if the thickness T is approximately equal to the nominal or expected thickness (XT). If it is determined at 461 that each wafer thickness T is about the same as the expected thickness XT (e.g., T~0.025), then the nominal thickness is identified at 462 and the method continues to step 471, wherein $\Delta Z$, and $\Delta R$ are determined.

If, however, the thickness T is not the expected value XT, then it is determined at 463 if the wafer thickness T is within the range of about 1.1 times the expected thickness (1.1XT) and less than about 1.9 times the expected thickness (1.9XT). If the wafer thickness is determined to be in the range 1.1XT<T<1.9XT (e.g., T~0.028 to 0.048), the cassette may be deformed or the wafer may be bowed and a disposition is generated that the cassette and/or the wafer (or wafer lot) should be held for further evaluation at 464.

If the thickness T is not in the range 1.1XT<T<1.9XT, then it is determined at 465 whether the wafer thickness T is about twice the expected thickness (T~2XT, or 1.9XT<T<2.1XT) (e.g., T~0.050). If the wafer is determined to be about twice the expected thickness 2XT, then two wafers may be stacked on top of each other within the wafer slot 135, which indicates a possible error caused by the wafer handling robot or a human error at a previous operation, whereby a disposition is generated that the stacked wafers should be rejected or otherwise held for further investigation such as a yield analysis at 466.

If the thickness T is not about twice the expected thickness 2XT, then it is determined at 467 whether the wafer thickness T is within the range between about slightly over twice the expected thickness (2.1XT) and about seven times the expected thickness (7XT), or whether the thickness is within the range between about slightly over twice the expected thickness 2.1XT and less than about the expected pitch P. If the wafer is determined to be in the range 2.1XT<T<7XT (e.g., T~0.053 to 0.150), or within the range 2.1XT<T<P (e.g., T~0.051 to 0.249), the cassette may be warped or tilted, whereby a disposition is generated that the cassette should be rejected at 468.

If the thickness T is not in the range 2.1XT<T<7XT or within the range 2.1XT<T<P, then it is determined at 469 if the wafer thickness T is greater than or equal to the pitch P. If the wafer is determined to be greater than or equal to the pitch P (e.g., T>=0.250), then a wafer may be cross-slotted, for example, between two slots 135. This situation may indicate a possible deformation of the cassette or a wafer handling problem, whereby a disposition is generated that the cassette should be held for further investigation at 470.

Thereafter, the range between the maximum deviation from the expected wafer position (MXZ), and the minimum deviation from the expected wafer position (MNZ) is calculated at 471 and compared to the allowable (predetermined) range R. Thus, the allowable range R between these two values may not be greater than MXZ−MNZ (e.g., 0.025>R). Further, no individual wafer position measurement Z may vary by more than an allowable deviation ΔZ from the expected wafer position XZ (|Z−XZ|<=ΔZ) (e.g., |Z−XZ|<=0.030). If it is determined at 471 that the calculated range (MXZ−MNZ) is greater than the allowable range R (MXZ−MNZ>R) or that any wafer measurement varies by more than the allowable deviation ΔZ (|Z−XZ|>ΔZ), then the cassette may be compressed and a disposition is generated that the wafer lot should be put on hold for cassette removal at 472, and the method 400 or 500 ends at step 495.

FIG. 8 illustrates still another example method 800 of measuring and evaluating the integrity of a wafer cassette employing the use of a wafer sorter and a cassette evaluation system similar to system 200 of FIG. 2 in accordance with the present invention. Method 800 is similar to method 600, and as such need not be fully described again for the sake of brevity. As described earlier, method 800 utilizes an alternate configuration of the fiber optic scan head 230, wherein the head is configured to directly scan features of the cassette itself, rather than scanning the wafers 210 within the cassette 220. Thus, in this example implementation, no wafers 210 would need to be present in the cassette 220.

Method 800 begins at 805, wherein the slots 135 or wafer supports 225 of the cassette 220 are scanned, for example, by a reconfigured sensor (not shown) affixed to and utilizing a wafer sorter 262 at 820. The positions (e.g., Z1-Z25 145) of the slots 135 or supports 225 are measured at 830 based on data from the sensor, the scan 820 and measurement 830 steps being further identified as a scan and measurement step 845.

The integrity of the cassette 220 is then evaluated and determined at 850 (e.g., using the modeling algorithm 272 and the modeling system 270) based on the slot 135 or wafer support 225 position measurements. Thereafter, the cassette evaluation method 800 ends at step 895. Optionally, a disposition may further be generated for the cassette, based on the cassette integrity determination. Thus, slot 135 or support 225 positions of the cassette 220 may be directly scanned and measured to enable evaluation of the cassette integrity.

It will be noted that the various aspects of methods 400, 500, 600, and 800 illustrated and described above are examples in nature, and that many alternative orderings of various optimization steps may be made in accordance with the spirit and scope of the present invention. In addition, the invention is not limited to the specific wafer handling system discussed herein, and may be implemented in association with other handling systems wherein cassette deformations occur in the fabrication of semiconductor wafers and products. The invention is also not limited to the use of silicon wafers, and may be implemented in association with the manufacture of various semiconductor devices, wafers, optical discs, data diskettes, thin film displays, or other such products utilizing a cassette which is subject to manufacturing changes and deformation, wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." Also, the term "exemplary", when utilized herein, simply denotes an illustrative example or instance, and not necessarily a preferred embodiment, unless otherwise indicated.

What is claimed is:

1. A method for evaluating the integrity of a wafer cassette using a wafer sorter, the method comprising:
    scanning a wafer sorter cassette mapping sensor over two or more wafers in two or more of a plurality of slots in the wafer cassette, using the wafer sorter;
    measuring the positions of the wafers in the wafer cassette using the sensor while scanning the sensor over the wafers;
    evaluating the wafer position measurements to determine slot positions within the cassette associated with the wafer position measurements;
    generating a determination of the integrity of the cassette based on the slot position determinations; and
    generating a disposition for the cassette based on the determination of the integrity of the cassette;
    wherein the generating the disposition for the cassette comprises:
        in response to the evaluation of the wafer position measurements indicating a deformation of the cassette above a predetermined value, replacing the cassette; or
        in response to the evaluation of the wafer position measurements indicating a deformation of the cassette below the predetermined value, updating a manufacturing database for trend analysis or for replacement forecasting.

2. The method of claim 1 wherein the wafer sorter cassette mapping sensor is affixed to the wafer sorter that is used to scan the sensor over the wafers in the slots of the wafer cassette.

3. The method of claim 1, further comprising:
    generating a disposition for the two or more wafers based on the determination of the integrity of the cassette.

4. A method for evaluating the integrity of a wafer cassette using a wafer sorter, the method comprising:

scanning a wafer sorter cassette mapping sensor over two or more wafers in two or more of a plurality of slots in the wafer cassette, using the wafer sorter;

measuring the positions of the wafers in the wafer cassette using the sensor while scanning the sensor over the wafers;

evaluating the wafer position measurements to determine slot positions within the cassette associated with the wafer position measurements;

generating a determination of the integrity of the cassette based on the slot position determinations; and generating a disposition for the cassette based on the determination of the integrity of the cassette;

wherein the generating the disposition for the cassette comprises:

replacing the cassette responsive to the evaluation of the wafer position measurements indicating:

a compression or side-to-side deformation of the cassette, wherein a slot pitch, comprising the distances between any two slots, is less than a predetermined value; or warped or tilted cassette, wherein the thickness of a wafer is greater than about double the expected wafer thickness, and less than about the slot pitch; or a deformation of the cassette causing a cross-slotted wafer, wherein the thickness of a wafer is about equal to the slot pitch, and rejecting the wafers for further yield analysis responsive to the evaluation of the wafer position measurements indicating that two or more wafers are stacked, wherein a thickness of a wafer, comprising the difference between a lower and an upper wafer position measurement, is about double an expected wafer thickness.

5. A method for evaluating the integrity of a wafer cassette using a wafer sorter, the method comprising:

scanning a wafer sorter cassette mapping sensor over two or more wafers in two or more of a plurality of slots in the wafer cassette, using the wafer sorter;

measuring the positions of the wafers in the wafer cassette using the sensor while scanning the sensor over the wafers;

evaluating the wafer position measurements to determine slot positions within the cassette associated with the wafer position measurements; and generating a determination of the integrity of the cassette based on the slot position determinations;

wherein measuring the positions of the wafers in the wafer cassette while scanning the sensor over the wafers comprises measuring a lower position associated with a bottom surface of each wafer and an upper position associated with a top surface of each wafer within the wafer cassette, by moving the sensor affixed to the wafer sorter vertically past each wafer within the wafer cassette, thereby creating a wafer position map of each wafer within the wafer cassette.

6. The method of claim 5, wherein a modeling system is used for evaluating the wafer position measurements to determine slot positions within the cassette associated with the wafer position measurements.

7. The method of claim 6, wherein the modeling system comprises a tool interdiction modeling system utilizing a software script.

8. The method of claim 5, further comprising generating a determination of the integrity of the wafers based on the evaluation of the wafer position measurements within the wafer cassette and determining a disposition of the wafers based upon the integrity determination.

9. A method for evaluating the integrity of a wafer cassette using a wafer sorter, the method comprising:

scanning a wafer sorter cassette mapping sensor over two or more wafers in two or more of a plurality of slots in the wafer cassette, using the wafer sorter;

measuring the positions of the wafers in the wafer cassette using the sensor while scanning the sensor over the wafers;

evaluating the wafer position measurements to determine slot positions within the cassette associated with the wafer position measurements;

generating a determination of the integrity of the cassette based on the slot position determinations; and generating a determination of the integrity of the wafers based on the evaluation of the wafer position measurements within the wafer cassette and determining a disposition of the wafers based upon the integrity determination;

wherein the wafer disposition comprises identifying and rejecting one or more of the cassette or the wafers responsive to the evaluation of the wafer position measurements indicating a deformed cassette or a bowed wafer, respectively, wherein a thickness of a wafer, comprising the difference between a lower and an upper wafer position measurement is greater than about 1.1 times an expected wafer thickness, and less than about 1.9 times the expected wafer thickness.

10. A cassette evaluation system, comprising:

two or more wafers;

a wafer cassette having a plurality of slots in the wafer cassette for holding the wafers;

a wafer sorter operable to hold and to pick a wafer from or place the two or more wafers into the plurality of slots in the wafer cassette;

a wafer sorter cassette mapping sensor affixed to the wafer sorter used to scan the sensor over the wafers in the slots of the wafer cassette, the sensor used to measure the positions of the wafers within the cassette; and a modeling system operable to map and evaluate the wafer position measurements, determine slot positions within the cassette associated with the wafer position measurements, and make a cassette integrity determination based upon the evaluation of the wafer position measurements;

wherein the cassette integrity determination and disposition thereof comprises:

replacing the cassette responsive to the evaluation of the wafer position measurements indicating a deformation of the cassette above a predetermined value, or updating a manufacturing database for trend analysis or for replacement forecasting responsive to the evaluation of the wafer position measurements indicating deformation of the cassette below the predetermined value.

11. The cassette evaluation system of claim 10, wherein the wafer sorter comprises one of a wafer handling robot or a wafer handling system.

12. The cassette evaluation system of claim 10, wherein the modeling system is further operable to make a determination of the integrity of the wafers based on a determination of the thickness of the wafers using the wafer position measurements within the wafer cassette.

13. The cassette evaluation system of claim 12, wherein the modeling system is further operable to determine a disposition of the wafer based upon the integrity determination and the evaluation of the wafer position measurements.

14. The cassette evaluation system of claim 10, wherein the modeling system comprises a tool interdiction modeling system utilizing a software script.

15. The cassette evaluation system of claim 10, wherein the wafer sorter cassette mapping sensor comprises one of a fiber-optic through beam transceiver, a photo diode emitter and a photo transistor receiver, and a reflective opto-coupler, and wherein the presence of the wafer within the cassette slot is indicated by breaking a beam of light.

16. The cassette evaluation system of claim 15, wherein the beam of light used by the sorter cassette mapping sensor is positioned parallel to the surface of the wafer, and wherein the beam is blocked by an edge of the wafer, thereby allowing the position of the wafer to be measured.

17. The cassette evaluation system of claim 10, wherein the wafer sorter scans the wafer sorter cassette mapping sensor past the wafers held in the wafer cassette to measure the positions of the wafers within the slots of the cassette, and wherein the presence of the wafer within the cassette slot is indicated by breaking a beam of light produced by the sensor.

18. The cassette evaluation system of claim 10, wherein the two or more wafers comprise known good test wafers or wafer test blanks.

19. A cassette evaluation system, comprising:
two or more wafers;
a wafer cassette having a plurality of slots in the wafer cassette for holding the wafers;
a wafer sorter operable to hold and to pick a wafer from or place the two or more wafers into the plurality of slots in the wafer cassette;
a wafer sorter cassette mapping sensor affixed to the wafer sorter used to scan the sensor over the wafers in the slots of the wafer cassette, the sensor used to measure the positions of the wafers within the cassette; and
a modeling system operable to map and evaluate the wafer position measurements, determine slot positions within the cassette associated with the wafer position measurements, and make a cassette integrity determination based upon the evaluation of the wafer position measurements;
wherein the cassette integrity determination and disposition thereof comprises:
rejecting the wafer responsive to the evaluation of the wafer position measurements indicating a deformation of the wafer above a predetermined value, or
updating a manufacturing database for trend analysis or for replacement forecasting responsive to the evaluation of the wafer position measurements indicating deformation of the wafer below the predetermined value.

20. A method for evaluating the integrity of a cassette, the method comprising:
scanning a cassette mapping sensor over two or more of a plurality of slots in the cassette using a wafer sorter or a scanning mechanism;
measuring the positions of the slots in the cassette using the sensor while scanning the sensor over the cassette;
evaluating the slot position measurements to determine the integrity of the cassette based on an evaluation of the slot positions;
generating a disposition for the cassette based on the determination of the integrity of the cassette and the slot position evaluation; and
replacing the cassette responsive to the evaluation of the slot position measurements indicating a deformation of the cassette above a predetermined value, or updating a manufacturing database for replacement forecasting or for trend analysis responsive to the evaluation of the slot position measurements indicating deformation of the cassette below the predetermined value.

21. The method of claim 20, wherein the generating of the disposition for the cassette comprises:
replacing the cassette responsive to the evaluation of the slot position measurements indicating:
a compression or side-to-side deformation of the cassette, wherein a slot pitch, comprising the distances between any two slots, is less than a predetermined value;
a deformation of the cassette, wherein the slot pitch, is greater than a predetermined value;
a deformation of the cassette, wherein a slot height, is less than a predetermined value, wherein the slot height is determined by evaluating the differences between a lower slot position associated with the bottom surface of the slot and an upper slot position associated with the top surface of the slot within the cassette; or
a deformation of the cassette, wherein a difference between a first slot pitch on a first side of the cassette and a second slot pitch on a second side of the cassette is greater than a predetermined value.

22. A method for evaluating the integrity of a cassette, the method comprising:
scanning a cassette mapping sensor over two or more of a plurality of slots in the cassette using a wafer sorter or a scanning mechanism;
measuring the positions of the slots in the cassette using the sensor while scanning the sensor over the cassette; and
evaluating the slot position measurements to determine the integrity of the cassette based on an evaluation of the slot positions;
wherein evaluating the slot position measurements to determine the integrity of the cassette based on an evaluation of the slot positions comprises:
determining a slot height by evaluating the differences between a lower slot position associated with the bottom surface of a slot and an upper slot position associated with the top surface of each slot within the cassette;
determining a slot pitch between each slot by evaluating the differences between all the lower slot position measurements or all the upper slot position measurements;
determining a minimum and a maximum height deviation from an expected slot position for all the lower slot position measurements and the upper slot position measurements from the expected slot positions, respectively; and
determining an average slot height and an average slot height deviation from the expected slot positions using one or more of the slot position evaluation, slot position map, and slot position determinations.

23. The method of claim 22, wherein the measuring the positions of the slots in the cassette while scanning the sensor over the cassette comprises:
measuring a lower slot position associated with a bottom surface of a slot and an upper slot position associated with a top surface of each slot within the cassette, by moving the sensor vertically past each slot of the cassette, thereby creating a slot position map of the cassette.

* * * * *

UNITED STATES PATENT AND TRADEMARK OFFICE
CERTIFICATE OF CORRECTION

PATENT NO. : 7,596,456 B2 Page 1 of 1
APPLICATION NO. : 11/282997
DATED : September 29, 2009
INVENTOR(S) : Mollenkopf et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 840 days.

Signed and Sealed this

Twenty-eighth Day of September, 2010

David J. Kappos
*Director of the United States Patent and Trademark Office*